US009145608B2

(12) United States Patent
Pak et al.

(10) Patent No.: US 9,145,608 B2
(45) Date of Patent: Sep. 29, 2015

(54) SCANNING INJECTOR ASSEMBLY MODULE FOR PROCESSING SUBSTRATE

(71) Applicant: Synos Technology, Inc., Fremont, CA (US)

(72) Inventors: Samuel S. Pak, San Ramon, CA (US); Sang In Lee, Sunnyvale, CA (US); Ilsong Lee, San Jose, CA (US); Hyo Seok Yang, Cupertino, CA (US)

(73) Assignee: Veeco ALD Inc., Fremont, CA (US)

( * ) Notice: Subject to any disclaimer, the term of this patent is extended or adjusted under 35 U.S.C. 154(b) by 33 days.

(21) Appl. No.: 13/849,477

(22) Filed: Mar. 23, 2013

(65) Prior Publication Data

US 2013/0260034 A1    Oct. 3, 2013

Related U.S. Application Data

(60) Provisional application No. 61/617,525, filed on Mar. 29, 2012.

(51) Int. Cl.
*C23C 16/455* (2006.01)
*C23C 16/44* (2006.01)

(52) U.S. Cl.
CPC ....... *C23C 16/45544* (2013.01); *C23C 16/4412* (2013.01); *C23C 16/45551* (2013.01); *C23C 16/45561* (2013.01); *C23C 16/45589* (2013.01)

(58) Field of Classification Search
CPC ............... C23C 16/45544; C23C 16/45551; C23C 16/45589; C23C 16/4412; C23C 16/45561
USPC ............ 118/715; 156/345.29, 345.33, 345.34
See application file for complete search history.

(56) References Cited

U.S. PATENT DOCUMENTS

| 4,796,562 | A | | 1/1989 | Brors et al. |
| 5,386,268 | A | * | 1/1995 | Ohlig et al. ..................... 355/70 |
| 5,676,472 | A | * | 10/1997 | Solomon et al. .............. 384/607 |
| 5,955,857 | A | * | 9/1999 | Kwon et al. ............. 318/568.11 |
| 5,983,438 | A | * | 11/1999 | Bostick et al. ............... 15/246.5 |
| 6,200,389 | B1 | * | 3/2001 | Miller et al. .................. 118/729 |
| 6,558,042 | B1 | * | 5/2003 | Tompkins .................... 384/133 |
| 2001/0045262 | A1 | * | 11/2001 | Gujer et al. .................... 156/345 |
| 2004/0189102 | A1 | * | 9/2004 | Miyamoto ....................... 310/12 |
| 2006/0070702 | A1 | * | 4/2006 | Kido et al. ................ 156/345.33 |
| 2006/0117888 | A1 | * | 6/2006 | Tsubono et al. ............ 74/424.91 |
| 2009/0068849 | A1 | * | 3/2009 | Endo et al. ..................... 438/763 |
| 2009/0165715 | A1 | | 7/2009 | Oh |

(Continued)

OTHER PUBLICATIONS

PCT International Search Report and Written Opinion, PCT Application No. PCT/US13/33208, Jun. 19, 2013, 10 pages.

*Primary Examiner* — Jeffrie R Lund
(74) *Attorney, Agent, or Firm* — Fenwick & West LLP

(57) ABSTRACT

An injection module assembly (IMA) that moves along a predetermined path to inject gas onto a substrate and discharge excess gas is described. The IMA may be used for processing a substrate that is difficult to move for various reasons such as a large size and weight of the substrate. The IMA is connected to one or more sets of jointed arms with structures to provide one or more paths for injecting the gas or discharging the excess gas. The IMA is moved by a first driving mechanism (e.g., linear motor) and the jointed arms are separately operated by a second driving mechanism (e.g., pulleys and cables) to reduce force or torque caused by the weight of the jointed arms. The movement of the first driving mechanism and the second driving mechanism is synchronized to move the IMA and the jointed arms.

12 Claims, 6 Drawing Sheets

(56) References Cited

U.S. PATENT DOCUMENTS

| | | |
|---|---|---|
| 2009/0178616 A1 | 7/2009 | Byun |
| 2010/0043712 A1 | 2/2010 | Tobe et al. |
| 2010/0233879 A1* | 9/2010 | Ryan .............................. 438/681 |
| 2010/0310771 A1* | 12/2010 | Lee ........................... 427/255.28 |
| 2011/0151119 A1* | 6/2011 | Lei et al. ..................... 427/248.1 |
| 2012/0196320 A1* | 8/2012 | Seibel et al. ................ 435/40.52 |
| 2013/0260034 A1* | 10/2013 | Pak et al. .................... 427/248.1 |

\* cited by examiner

SCANNING INJECTOR ASSEMBLY MODULE FOR PROCESSING SUBSTRATE

CROSS-REFERENCE TO RELATED APPLICATION

This application claims priority under 35 U.S.C. §119(e) to co-pending U.S. Provisional Patent Application No. 61/617,525, filed on Mar. 29, 2012, which is incorporated by reference herein in its entirety.

BACKGROUND

1. Field of Art

The present disclosure relates to an injector assembly module for performing deposition of material on a substrate or treating the surface of the substrate by injecting gas onto the substrate.

2. Description of the Related Art

Various chemical processes are used to deposit material on a substrate. Such chemical processes include chemical vapor deposition (CVD), atomic layer deposition (ALD) and molecular layer deposition (MLD). CVD is the most common method for depositing a layer of material on a substrate. In CVD, reactive gas precursors are mixed and then delivered to a reaction chamber where a layer of material is deposited after the mixed gas comes into contact with the substrate.

ALD is another way of depositing material on a substrate. ALD uses the bonding force of a chemisorbed molecule that is different from the bonding force of a physisorbed molecule. In ALD, source precursor is absorbed into the surface of a substrate and then purged with an inert gas. As a result, physisorbed molecules of the source precursor (bonded by the Van der Waals force) are desorbed from the substrate. However, chemisorbed molecules of the source precursor are covalently bonded, and hence, these molecules are strongly adsorbed in the substrate and not desorbed from the substrate. The chemisorbed molecules of the source precursor (adsorbed on the substrate) react with and/or are replaced by molecules of reactant precursor. Then, the excessive precursor or physisorbed molecules are removed by injecting the purge gas and/or pumping the chamber, obtaining a final atomic layer.

MLD is a thin film deposition method similar to ALD but in MLD, molecules are deposited onto the substrate as a unit to form polymeric films on a substrate. In MLD, a molecular fragment is deposited during each reaction cycle. The precursors for MLD have typically been homobifunctional reactants. MLD method is used generally for depositing polymers or hybrid organic-inorganic thin films on the substrate.

In order to perform spatial ALD or MLD deposition methods on a substrate, the substrate is moved relative to stationary injectors for exposure to different gases. However, as the size or weight of the substrate increases, the devices and components for moving the substrate becomes excessively large or inefficient.

SUMMARY

Embodiments relate to treating a surface of a substrate or depositing a layer of material on a substrate using a first driving mechanism to move an injection module assembly across a substrate by and using a second driving mechanism to rotate a set of arms connected to the injection module. A gas is injected into the injection module assembly having a surface facing the substrate via a path formed in the set of arms. The set of arms includes at least a first arm, and a second arm having an end rotatably connected to an end of the first arm by a hinge. The other end of the first arm is rotatably connected to the injection module and the other end of the second arm rotatably connected to a stationary port. The set of arms is rotated by a second driving mechanism at a speed that causes the other end of the first arm to move at the same speed and the same direction as the injection module assembly.

In one embodiment, excess gas remaining after exposing the substrate to the gas from the injection module assembly is discharged via a path formed in another set of arms between the injection module assembly and another stationary port. The other set of arms is also rotated by the second driving mechanism.

In one embodiment, the first driving mechanism includes a linear motor in the injection module assembly and a shaft for supporting the linear motor.

In one embodiment, the second driving mechanism includes a motor, pulleys in the set of arms, and cables extending between the pulleys.

In one embodiment, ferrofluid seals are provided to seal gaps between the hinge and the set of arms.

In one embodiment, the gas is source precursor or reactant precursor for performing atomic layer deposition (ALD) on the substrate.

In one embodiment, the gas is routed to chambers of the injection module assembly for receiving the gas and exposing the substrate to the gas via channels formed in the injection module assembly.

In one embodiment, the removal of physisorbed molecules of the gas on the substrate is facilitated by passing the gas through a constriction zone formed on the surface of the injection module assembly facing the substrate. The constriction zone is formed between a chamber for receiving the gas and an exhaust cavity formed in the injection module assembly.

In one embodiment, the height of the constriction zone is smaller than ⅓ of the height of the chamber.

In one embodiment, the height of the constriction zone is smaller than ⅓ of a width of the chamber.

In one embodiment, the excess gas is routed to the path in the other set of arms via channels formed in the injection module assembly.

DETAILED DESCRIPTION OF EMBODIMENTS

Figure 1:
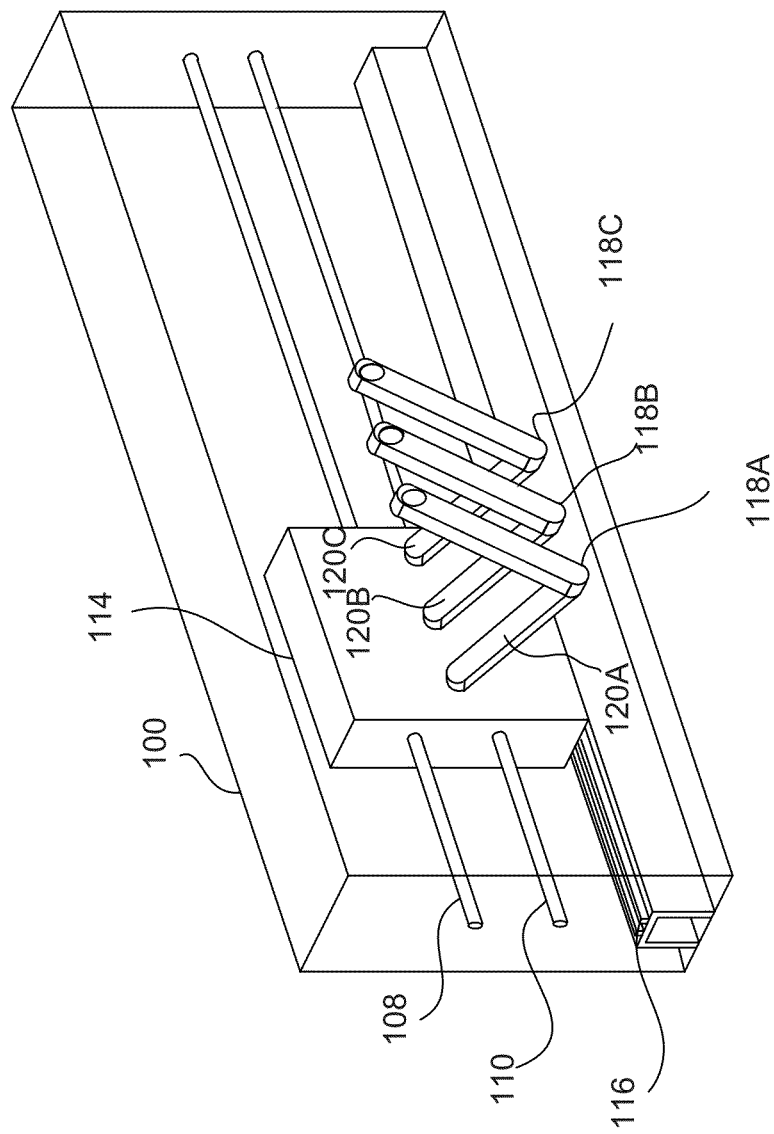
FIG. 1 is a perspective view of a processing apparatus including an injection module assembly, according to one embodiment.

Embodiments are described herein with reference to the accompanying drawings. Principles disclosed herein may, however, be embodied in many different forms and should not be construed as being limited to the embodiments set forth herein. In the description, details of well-known features and techniques may be omitted to avoid unnecessarily obscuring the features of the embodiments.

In the drawings, like reference numerals in the drawings denote like elements. The shape, size and regions, and the like, of the drawing may be exaggerated for clarity.

Embodiments relate to an injection module assembly (IMA) that moves along a predetermined path to inject gas onto a substrate and discharge excess gas from the IMA. The IMA may be used for processing a substrate that is difficult to move for various reasons such as a large size and the weight of the substrate. The IMA is connected to one or more sets of jointed arms with structures to provide one or more paths for injecting the gas or discharging the excess gas. The IMA is moved by a first driving mechanism (e.g., linear motor) and the jointed arms are separately operated by a second driving mechanism (e.g., pulleys and cables) to reduce force or torque applied to hinges between the jointed arms. The movement of the first driving mechanism and the operation of the second driving mechanism is controlled so that the IMA and the jointed arms move in a synchronized manner.

FIG. 1 is a perspective view of a processing apparatus 100 including an IMA 114, according to one embodiment. The processing apparatus 100 is used for depositing a layer of material on a substrate or treating the surface of the substrate by injecting one or more types of gas onto the substrate. The processing apparatus 100 may form an enclosed area to house the IMA 114. In one embodiment, the enclosed area within the processing apparatus 100 is retained at a low pressure or in a vacuum state (e.g., under 10 mTorr). At one side of the processing apparatus 100, a substrate and a susceptor holding the substrate are placed for exposure to gas injected by the IMA 114.

The IMA 114 is placed on a linear motion guide on a rail 116 or other supporting structures for sliding movement along a predetermined path. The predetermined path may be straight or curved. In one embodiment, a sliding bearing is provided at the bottom of the IMA 114 or top of the rail 116 to reduce friction associated with the movement of the IMA 114. Alternative structures such as suspension rods extending from the ceiling of the processing apparatus to the IMA 114 may also be used for slidably supporting the IMA 114.

The IMA 114 may be moved horizontally by various driving mechanisms. An example driving mechanism for moving the IMA 114 horizontally includes linear motors that operate on extension shafts 108, 110. Alternatively, the IMA 114 may be supported by one or more shafts formed with screws on their outer surfaces. The screwed shafts may operate in conjunction with a screw formed on or in the IMA 114 to move the IMA 114 horizontally as the screwed shafts or the screw in the IMA 114 is rotated.

The IMA 114 is connected to a plurality of sets of arms to inject gas into the IMA 114 or discharge excess gas from the IMA 114. In the example of FIG. 1, the IMA 114 is connected to three sets of arms, (i) a first set of arms including arms 118A and 120A for injecting the source gas and discharging the excess gas (including by-products) from the IMA 114, (ii) a second set of arms including arms 118B and 120B for generating radicals using plasma through the electrical cables (not shown) inserted into the pipings of arms, and (iii) a third set of arms including arms 118C and 120C for injecting radicals generated by plasma as a reactant gas and discharging the excess reactant (and by-products) from the IMA 114. One end of each arm is rotatably connected to each other by a hinge and the other ends of the arms are connected either to the IMA 114 or to a stationary port (connected to a piping structure) outside the processing apparatus 100. Taking the example of the first set of arms, the arm 120A has one end connected to the IMA 114, and the other end connected to the other arm 118A. The arm 118A has the remaining end connected to a port for discharging excess gas and by-products from the processing apparatus 100. The relative angle between the arms in the sets of arms changes as the IMA 114 moves horizontally.

Each of the sets of arms may include a path for either injecting gas into the IMA 114 and/or discharging excess gas from the IMA 114. For example, the second set of arms may include a path for sequentially injecting a source precursor or a reactant precursor into the IMA 114 while the first set of arms includes a path for discharging the excess source precursor from the IMA 114 and the third set of arms includes a path for discharging the excess reactant precursor from the IMA 114. By injecting the source precursor and the reactant precursor followed by discharge of the gas, deposition processes such as atomic layer deposition (ALD), chemical vapor deposition (CVD) and molecular layer deposition (MLD) may be performed. The set of arms may also inject purge gas or discharge other types of gas to perform processing on the substrate other than deposition. The arms are rotated by using a driving mechanism including a motor (not shown), pulleys and cables between the pulleys, as described below in detail with reference to FIGS. 4A and 4B. The arms may be heavy and the hinges or joints connecting these arms may wear out prematurely if the arms are moved passively by the movement of the IMA 114. Some of many advantages of providing a separate driving mechanism to rotate the arms are that the hinges can have a longer lifespan, and that a linear motor of lower power capacity may be used to move the IMA 114.

Figure 2A:
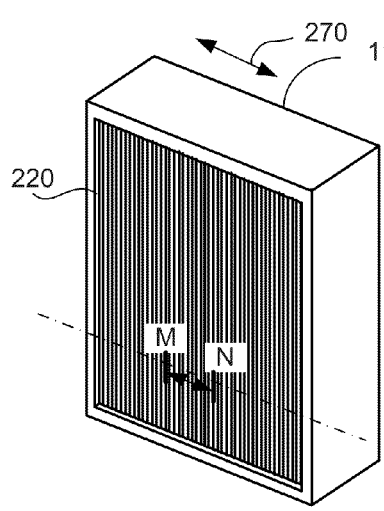
FIG. 2A is a perspective view of an injection module assembly (IMA), according to one embodiment.

FIG. 2A is a perspective view of the IMA 114, according to one embodiment. The IMA 114 includes a surface 220 facing the substrate 214 and the susceptor 310. The surface 220 is formed with a plurality of vertical chambers 232 and constriction zones 230 in the shape of slits for receiving the injected gas and then exposing the substrate 214 to the injected gas. The surface 220 also includes exhaust cavity 236 to discharge excess gas and by-products not adsorbed in the substrate 214. The IMA 114 moves horizontally in a direction indicated by arrow 270.

Figure 2B:
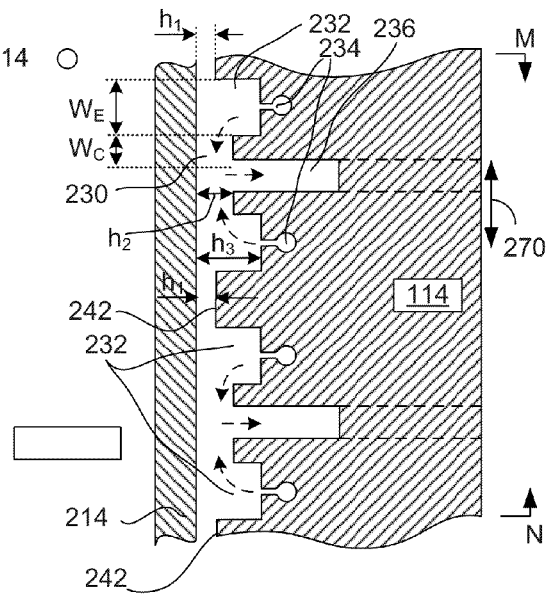
FIG. 2B is a partial cross sectional view of the IMA taken along line M-N of FIG. 2A, according to one embodiment.

FIG. 2B is a partial cross sectional view of the IMA 114 taken along line M-N of FIG. 2A, according to one embodiment. The surface 220 of the IMA 114 is formed with chambers 232 extending vertically along the IMA 114. The substrate 214 comes into contact with the gas at a side of the chamber 232. The chambers 232 receive gas via channels 234 (formed in the IMA 114) and the path in the set of arms (e.g., the first set of arms including arms 118B, 120B). The gas fills chambers 232 and is then passes through constriction zones 230, exhaust cavity 236 formed in the IMA 114. Each of the chambers 232 has the width of $W_E$ and the height of $h_3$. The exhaust cavities 236 are connected to an exhaust channel (shown as 512 in FIG. 5A), which is in turn connected to the path (e.g., path formed by tubing 530, as described below in detail with reference to FIG. 5B) in the set of arms.

The gas in chamber 232 travels to the exhaust cavities 236 via constriction zones 230 having the width of $W_C$ and the height of $h_2$. The height $h_2$ is smaller than height $h_3$. While the gas travels through the constriction zones 230, Venturi effect causes the speed of the gas to increase and the pressure of the gas to drop. Hence, the removal of physisorbed gas molecules from the surface of the substrate 214 is facilitated while the gas is passing through the constriction zones 230. To enhance the removal of the physisorbed gas molecules from the surface of the substrate, some gas channels 234 can be used for injecting purge gas such as Argon. In one embodiment, height $h_2$ is less than ⅓ of height $h_3$. To cause Venturi effect, it is also advantageous to have the height $h_2$ to be less than ⅓ of the width $W_E$.

The surface 220 is formed with many sets of chambers 232 and constriction zones 230 where each set is separated by a wall 242. The wall 242 is spaced away from the substrate 214 by distance $h_1$. Although it is advantageous to have a smaller $h_1$ to avoid mixing of gas from different chambers 232, manufacturing tolerance, non-planar artifacts on the substrate 214 and/or the susceptor 310 holding the substrate 214 and other considerations limit the minimal distance $h_1$. Gas such as Argon may be injected via a perforation (not shown) formed in the wall 242 to form a gas curtain to prevent mixing of gases in different chambers 232.

Figure 3:
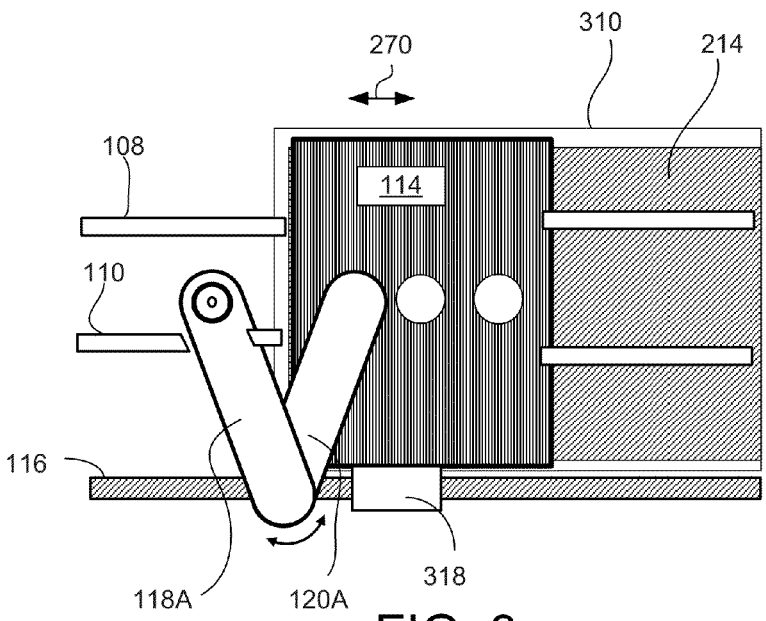
FIG. 3 is a side view of the IMA of a processing apparatus according to one embodiment.

FIG. 3 is a side view of the IMA 114 of the processing apparatus according to one embodiment. The IMA 114 is placed on a sliding bearing 318 that moves on the rail 116 and functioning to guide linear motions. The IMA 114 moves across the substrate 214 and the susceptor 310 horizontally as indicated by arrow 270 to process the surface of the substrate 214.

The IMA 114 may move in one direction or reciprocate in both directions to perform processing on the surface of the substrate 214. In FIG. 3, only one set of arms 118A, 120A is illustrated for the sake of convenience. As described above with reference to FIG. 1, the extension shafts 108, 110 interact with the linear motors installed in the IMA 114 to move the IMA 114 horizontally.

Figure 4A:
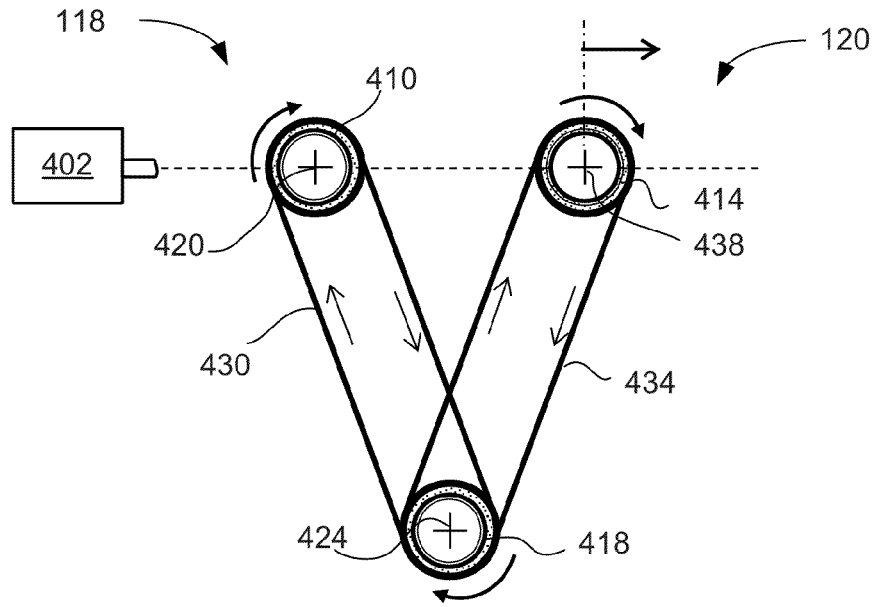
FIGS. 4A and 4B are diagrams of jointed arms attached to the IMA and operated by pulleys, according to one embodiment.
Figure 4B:
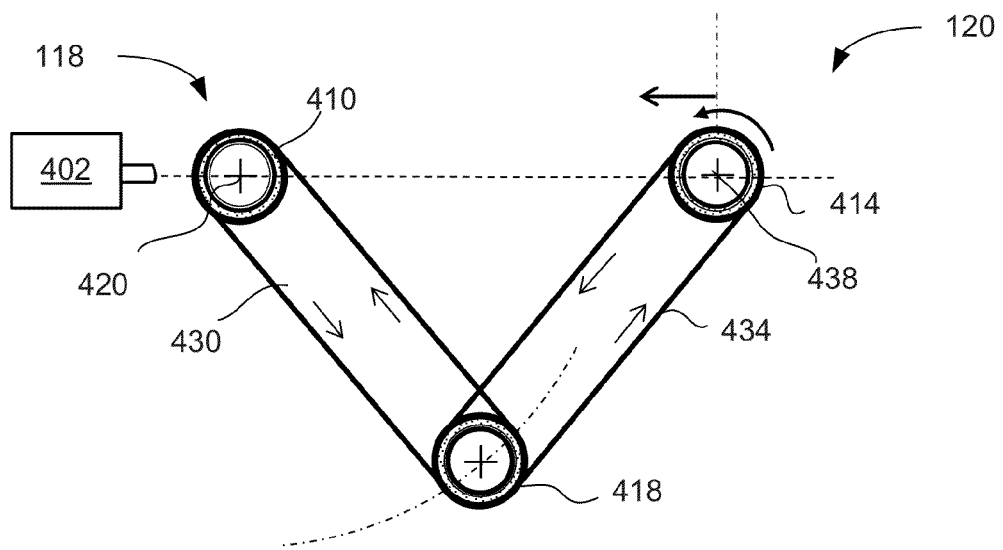

FIGS. 4A and 4B are diagrams of jointed arms 118, 120 attached to the IMA 114 and operated by pulleys 410, 414, 418, according to one embodiment. The pulley 410 is fixed to the arm 118 and the end of the arm 118 is rotatably fixed to an outer wall of the processing apparatus 100 to deliver gas (e.g., precursor) to the IMA 114 and discharge excess gas and by-products from the IMA 114. The rotation of the pulley 410 causes the arm 118 to rotate and causes the pulley 418 to rotate. The pulley 418 is fixed to the arm 120, and hence, the rotation of pulley 418 by the cable 430 causes the arm 120 to rotate relative to the arm 118. The pulley 414 is fixed to the IMA 114. The movement of the cable 434 causes the pulley 414 to make a rotation at an angle that would be caused by the linear movement of the IMA 114.

A motor 402 drives the pulley 410 at the stationary end of arm 118. The motor 402 may be connected to the pulley 410 to directly rotate the pulley 410 or rotate the pulley 410 via gears, pulleys or other power transmission components between the motor 402 and the pulley 410.

In one embodiment, the rotation of the motor 402 and the movement of the linear motors of the IMA 114 are operated by a common controller (not shown). The controller sends out signals to operate the motor 402 and the linear motors in a synchronized manner.

In the examples of FIGS. 4A and 4B, the pulleys 410 and 414 rotate in the same direction whereas the pulley 418 rotates in the opposite direction. As shown in FIG. 4A, when the IMA 114 moves to the right, the pulleys 410 and 414 rotate in a clockwise direction whereas the pulley 418 rotates in a counterclockwise direction to synchronize with the movement of the IMA 114. Conversely, when the IMA 114 moves to the left, the pulleys 410 and 414 rotate in the counterclockwise direction whereas the pulley 418 rotates in the clockwise direction to synchronize with the movement of IMA 114. The rotating speed and the direction of the pulleys 410, 414, 418 are controlled so that the linear speed of the IMA 114 coincides with the linear speed of axis 438 of the pulley 414.

The arms 118, 120 may include various components that may increase their weight. Hence, if the arms 118, 120 are moved passively by the linear movement of the IMA 114, the hinges of these arms 118, 120 may be subject to excessive force and/or torque. By rotating and moving the arms 118, 120 by a mechanism separate from the movement of the IMA 114, the hinges of the arms 118, 120 are subject to reduced torque and/or force compared to the case when the movement of the arms 118, 120 is driven by the linear movement of the IMA 114. The reduced torque and/or force associated with the hinges enable the arms 118, 120 and their hinges to have a longer lifespan.

In other embodiments, other mechanisms including but not limited to gears or shafts may be used instead of pulleys and cables to rotate the arms 118, 120.

Figure 5A:
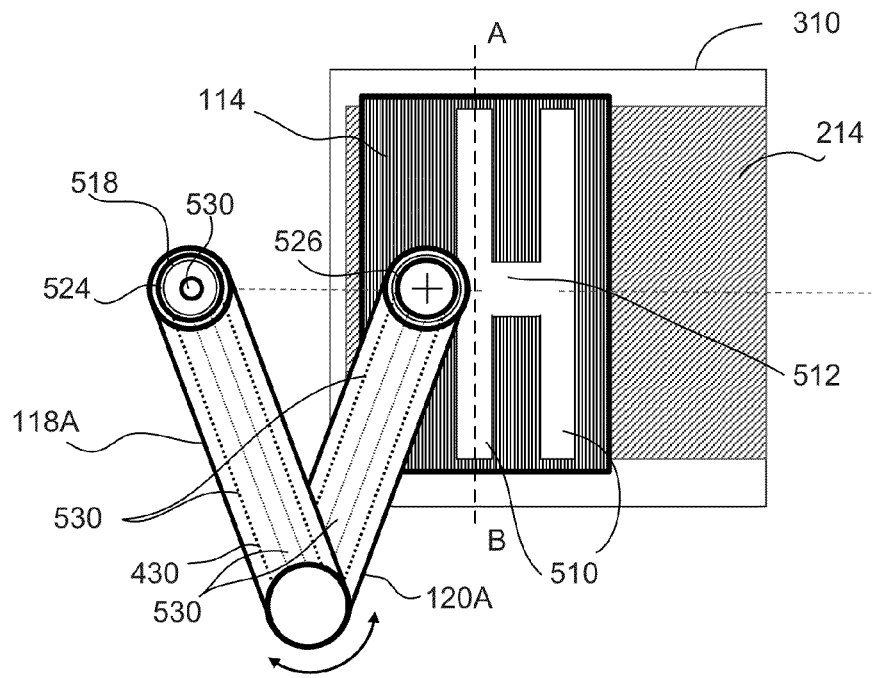
FIGS. 5A and 5B are diagrams illustrating discharging of excess gas from the IMA via jointed arms, according to one embodiment.
Figure 5B:
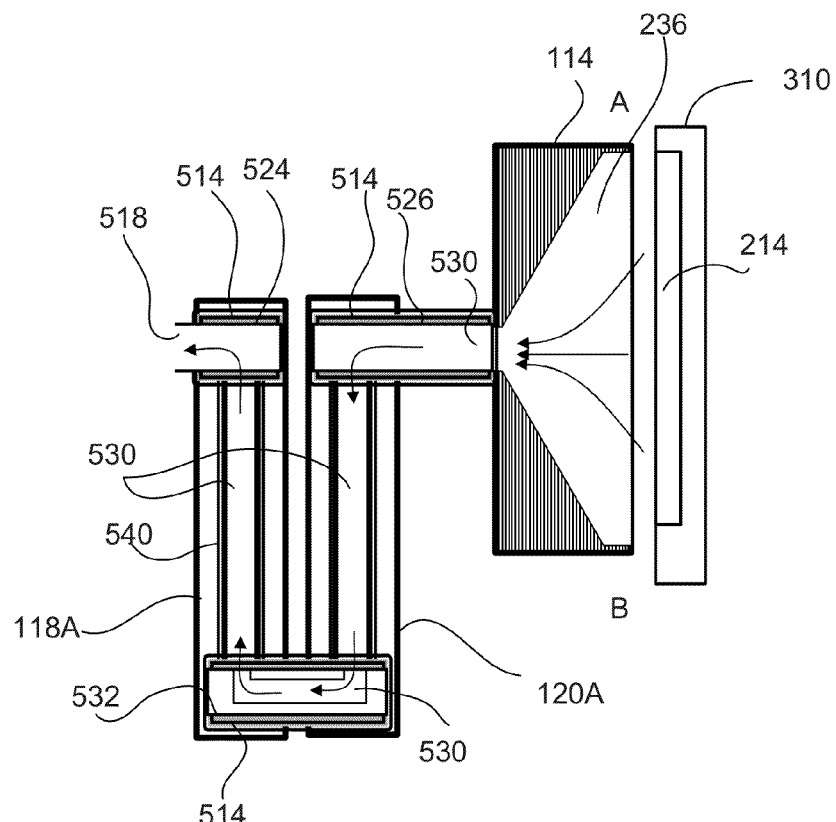

FIGS. 5A and 5B are diagrams illustrating discharging of excess gas from the IMA 114 via jointed arms 118A, 120A, according to one embodiment. An outer cylinder component of a ferrofluid seal component may function as a pulley. That is, the pulleys 410, 414, 418 may be formed of the outer cylinder components of the ferrofluid seal 514. Alternatively, each pulley (not shown) can be attached at the end of the outer cylinder component of the ferrofluid seal 514. The arms 118A, 120A includes tubing 530 for discharging the excess gas received via the exhaust cavity 236 formed in the IMA 114. The excess gas is discharged from the IMA 114 via port 518 and a path formed of tubing 530 that extends across the arm 120A, a hinge 532 (connecting the arms 118A, 120A) and the arm 118A. The IMA 114 is formed with channels 510 to convey the excess gas received via the exhaust cavity 236 to the tubing 530.

Hinge 524 is provided between an external port (not shown) and the arm 118A to enable rotation of the arm 118A relative to the external port. The external port is connected to a pipe to a discharge mechanism. Hinge 532 is placed between the two arms 118A, 120A to enable the relative rotation between the arms 118A, 120A. Hinge 526 is placed between the arm 120A and the IMA 114 to enable the rotation of the arm 120A relative to the IMA 114. Ferrofluid seals 514 may be provided to surround hinges 524, 526, 532 so that the excess gas traveling through these hinges does not leak out of the arms 118A, 120A as the arms 118A, 120A are rotated and moved about.

In one embodiment, a pipe or a tubing 530 may be installed in the path to prevent leaking of gas even when fracture or crack occurs in the arms 118A, 120A or hinges 524, 526, 532.

Figure 6A:
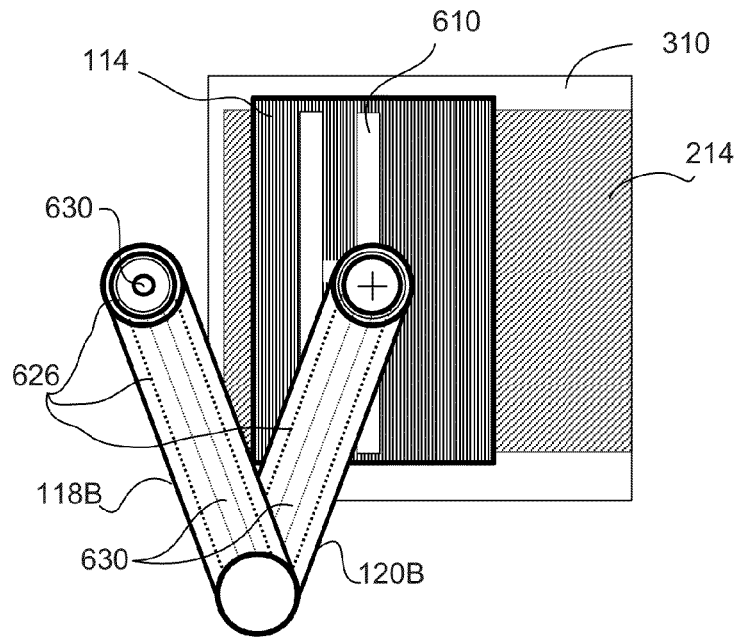
FIGS. 6A and 6B are diagrams illustrating injection of gas into the IMA via jointed arms, according to one embodiment.
Figure 6B:
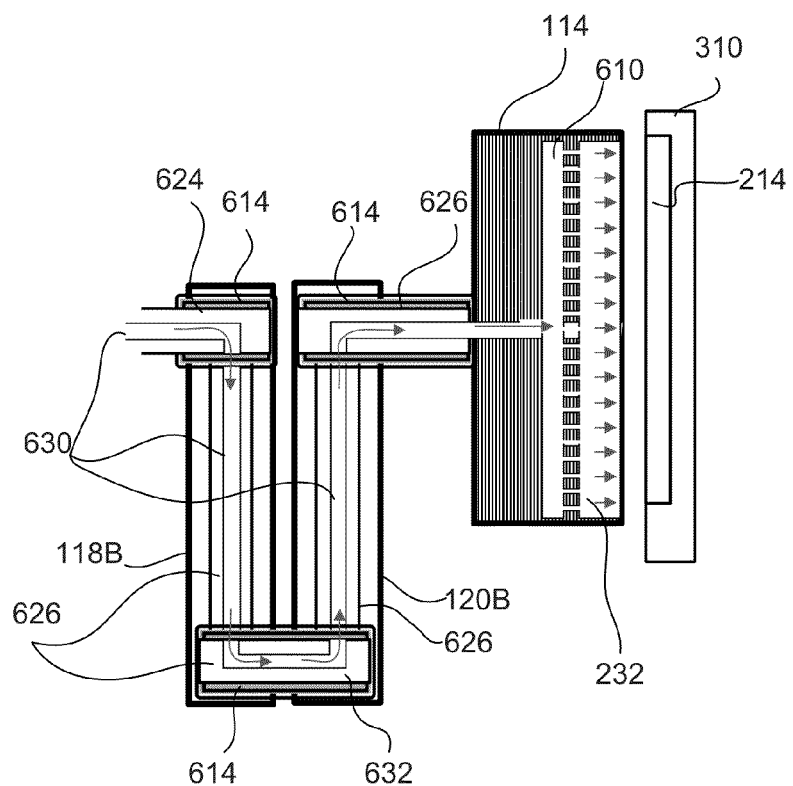

FIGS. 6A and 6B are diagrams illustrating injection of gas into the IMA 114 via jointed arms 118B, 120B, according to one embodiment. The jointed arms 118B, 120B have the same structure as the jointed arms 118A, 120A, as described above with reference to FIGS. 5A and 5B. The jointed arms 118B, 120B are similar to the jointed arms 118A, 120A in that a path formed of tubing 630 in the jointed arms 118B, 120B are used for injecting gas into the IMA 114, and another path formed of tubing 626 surrounding tubing 630 is used for discharging excess gas from the IMA 114.

Channels 610 are formed in the IMA 114 to convey the gas injected into the IMA 114 to the chambers 232. The gas fills the chambers 232 and is then injected onto the substrate 214. The arms 118B and 120B are connected by hinges 624, 626, 632 in the same manner as the arms 118A and 120A, as described above with reference to FIGS. 5A and 5B. Ferrofluid seals 614 may be provided at hinges 624, 626, 632 so that the gas does not leak out of the arms 118B, 120B as the arms 118B, 120B are rotated and moved about. The gap between the arms 118B, 120B and the hinges 624, 626, 632 are also sealed by ferrofluid seals 614.

The arms 118C and 120C have the same structure as the arms 118A and 120A except these arms 118C and 120C are placed at the right end of the IMA 114, and therefore, description thereof is omitted herein for the sake of brevity.

Although embodiments described herein relate to a processing apparatus processing a substrate that is erected vertically, other embodiments may process a substrate that lies flat on a susceptor or lies with an inclined angle with respect to the vertical position. Also, although embodiments described herein uses the same set of arms to inject two different types of gases to the IMA, other embodiments may use two or more sets of arms to inject different types of gases.

In other embodiments, a single set of arms may be used for injecting and discharging the same or different gases. For this purpose, the set of arms may include multiple paths for carrying different gases or flow direction.

Figure 7:
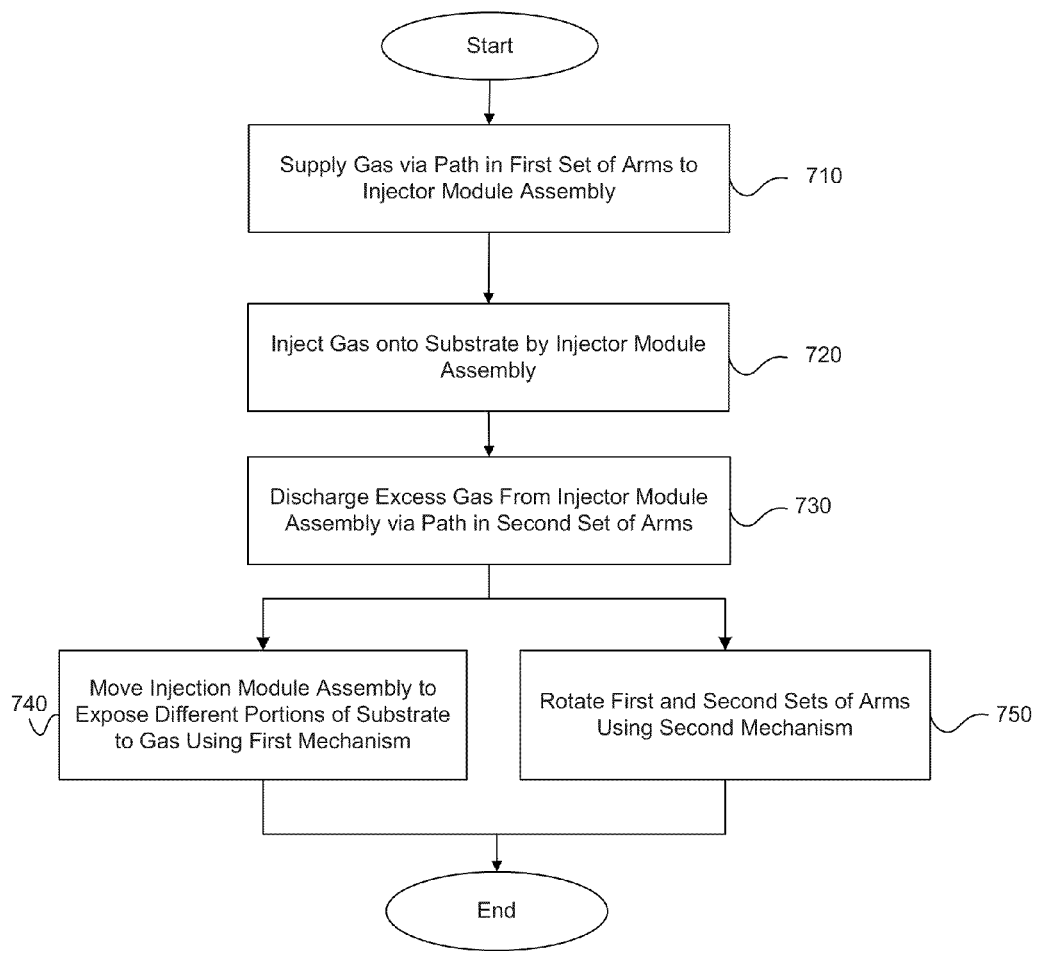
FIG. 7 is a flowchart illustrating a process of operating the IMA to process a substrate, according to one embodiment.

FIG. 7 is a flowchart illustrating a process of operating the IMA 114 to process the substrate 214, according to one embodiment. Gas is supplied 710 via a path (e.g., path formed of tubing 630) in a first set of arms (e.g., arms 118B, 120B) to the IMA 114. The gas is injected 720 by the IMA 114 onto the substrate 214. The gas injected may be source precursor, reactant precursor, purge gas or a combination thereof. As a result of the injection, the substrate 214 may be adsorbed with the gas molecules or be surface treated with the gas.

Excessive gas remaining after exposure of the substrate 214 is then discharged 730 from the IMA 114 via a path (e.g., path formed of tubing 530) in the second set of arms (e.g., arms 118A, 120A). Excessive gas may include gas injected by the IMA 114 or a converted gas derived by chemical interaction. Instead of using the second set of arms, the same set of arms for supplying the gas may be used to discharge the excessive gas using another path formed in the set of arms.

The IMA 114 is moved 740 to expose different portions of the substrate 214 to the injected gas using a first driving mechanism. In one embodiment, the IMA 114 is moved horizontally. The first driving mechanism may include, for example, linear motors and extending shafts 108, 110.

In parallel with moving 740 of the IMA 114, the first and second sets of arms are rotated 750 using a second driving mechanism. The second driving mechanism may include motors, pulleys and cables. The movement of the first and second arms is synchronized with the linear movement of the IMA 114 so that ends of arms connected to the IMA 114 are moved at the same speed and direction as the IMA 114 by the second driving mechanism.

In one embodiment, a set of arms connecting an external port and the IMA include more than two arms. A pulley may be placed in each of the more than two arms and be rotated by cables or chain to synchronize the movement of the arms relative to the linear movement of the IMA.

Although the present invention has been described above with respect to several embodiments, various modifications can be made within the scope of the present invention. Accordingly, the disclosure of the present invention is intended to be illustrative, but not limiting, of the scope of the invention, which is set forth in the following claims.

What is claimed is:

1. A processing apparatus comprising:
an injection module assembly configured to move at a speed relative to a substrate and parallel to a surface of the substrate by a first driving mechanism while the substrate remains stationary to inject gas onto different portions of the substrate, the gas injected onto the different portions of the substrate at a surface of the injection module assembly facing the substrate;
a set of arms comprising at least a first arm and a second arm having an end rotatably connected to an end of the first arm by a hinge, another end of the first arm rotatably connected to the injection module and another end of the second arm rotatably connected to a stationary port, a path formed in the set of arms to inject the gas into the injection module assembly; and
a second mechanism configured to rotate the set of arms that causes a linear motion at the other end of the first arm at the speed of the injection module assembly.

2. The apparatus of claim 1, further comprising another set of arms between the injection module assembly and another stationary port, the other set of arms formed with a path for discharging excess gas from the injection module assembly.

3. The apparatus of claim 2, wherein the injection module assembly is formed with channels for routing the excess gas from the surface of the injection module to the path in the other set of arms.

4. The apparatus of claim 1, wherein the first mechanism comprises a linear motor in the injection module assembly and a shaft on which the linear motor moves, and wherein the second mechanism comprises a motor, pulleys in the set of arms, and cables extending between the pulleys.

5. The apparatus of claim 1, further comprising a ferrofluid seal configured to seal a gap between the hinge and the set of arms.

6. The apparatus of claim 1, wherein the gas is source precursor or reactant precursor for performing atomic layer deposition (ALD) on the substrate.

7. The apparatus of claim 1, wherein the injection module assembly is formed with channels to route the gas injected into the injection module assembly to chambers configured to receive the gas and expose the substrate to the gas.

8. The apparatus of claim 1, wherein the surface of the injection module assembly comprises a constriction zone configured to facilitate removal of physisorbed molecules of the gas on the substrate by passing the gas through the constriction zone, the constriction zone formed on the surface of the injection module assembly between a chamber for receiving the gas and an exhaust cavity for discharging the excess gas.

9. The apparatus of claim 8, wherein a height of the constriction zone is smaller than ⅓ of a height of the chamber.

10. The apparatus of claim 8, wherein a height of the constriction zone is smaller than ⅓ of a width of the chamber.

11. The apparatus of claim 1, wherein the injection module assembly moves horizontally.

12. The apparatus of claim 1, wherein the set of arms are attached to a side of the injection module assembly opposite to the surface of the injection module assembly facing the substrate.

* * * * *